United States Patent
Bhutta

(10) Patent No.: US 7,298,128 B2
(45) Date of Patent: Nov. 20, 2007

(54) METHOD OF DETECTING RF POWDER DELIVERED TO A LOAD AND COMPLEX IMPEDANCE OF THE LOAD

(75) Inventor: Imran Ahmed Bhutta, Mount Laurel, NJ (US)

(73) Assignee: Innovation Engineering LLC, Mount Laurel, NJ (US)

( * ) Notice: Subject to any disclaimer, the term of this patent is extended or adjusted under 35 U.S.C. 154(b) by 3 days.

(21) Appl. No.: 11/329,977

(22) Filed: Jan. 11, 2006

(65) Prior Publication Data
US 2006/0170367 A1    Aug. 3, 2006

Related U.S. Application Data

(60) Provisional application No. 60/643,014, filed on Jan. 11, 2005.

(51) Int. Cl.
*G01R 23/16* (2006.01)
*G06F 19/00* (2006.01)

(52) U.S. Cl. .............. 324/76.12; 324/76.15; 324/96; 702/64

(58) Field of Classification Search ......... 324/76.11, 324/76.15, 464, 76.12, 76.13, 76.14, 96; 702/60, 64
See application file for complete search history.

(56) References Cited

U.S. PATENT DOCUMENTS

| | | | |
|---|---|---|---|
| 4,542,336 A * | 9/1985 | Powell | ............ 324/76.24 |
| 4,967,159 A * | 10/1990 | Manes | ............ 324/650 |
| 5,127,405 A * | 7/1992 | Alcala et al. | ............ 600/342 |
| 5,565,737 A | 10/1996 | Keane | |
| 5,576,629 A | 11/1996 | Turner et al. | |
| 5,630,227 A * | 5/1997 | Bella et al. | ............ 455/324 |
| 5,705,931 A | 1/1998 | Klick | |
| 5,770,922 A | 6/1998 | Gerrish et al. | |
| 5,808,415 A | 9/1998 | Hopkins | |
| 5,861,752 A | 1/1999 | Klick | |
| 6,046,594 A * | 4/2000 | Mavretic | ............ 324/520 |
| 6,449,568 B1 | 9/2002 | Gerrish | |
| 6,522,121 B2 | 2/2003 | Coumou | |
| 6,608,446 B1 | 8/2003 | Coumou | |
| RE38,273 E | 10/2003 | Gerrish et al. | |
| 6,657,394 B2 | 12/2003 | Nasman | |
| 6,707,255 B2 | 3/2004 | Coumou et al. | |
| 6,708,123 B2 | 3/2004 | Gerrish | |

(Continued)

FOREIGN PATENT DOCUMENTS

| | | |
|---|---|---|
| EP | 0753876 B1 | 1/1997 |
| EP | 1248361 A2 | 10/2002 |
| GB | 2315620 A | 2/1998 |
| IE | 970367 | 1/1999 |

*Primary Examiner*—Anjan Deb
(74) *Attorney, Agent, or Firm*—Pepper Hamilton LLP

(57) ABSTRACT

Methods and systems of detecting one or more characteristics of a load are disclosed. One or more characteristics of a first signal may be detected at the output of a Radio Frequency (RF) power generator. The first signal may have a fundamental frequency. The one or more characteristics of the first signal may be sampled at a sampling frequency to produce a digital sampled signal. The sampling frequency may be determined based on a function of the fundamental frequency of the first signal. One or more characteristics of a load in communication with the RF power generator may then be determined from the digital sampled signal.

16 Claims, 3 Drawing Sheets

U.S. PATENT DOCUMENTS

| | | |
|---|---|---|
| 6,841,124 B2 | 1/2005 | Chien et al. |
| 6,873,114 B2 | 3/2005 | Avoyan et al. |
| 6,887,339 B1 | 5/2005 | Goodman et al. |
| 2004/0044486 A1* | 3/2004 | Tignor ......................... 702/64 |
| 2004/0150386 A1* | 8/2004 | Gonzalez et al. ....... 324/117 R |
| 2007/0004349 A1* | 1/2007 | Ranganathan et al. ... 455/127.1 |

* cited by examiner

METHOD OF DETECTING RF POWDER DELIVERED TO A LOAD AND COMPLEX IMPEDANCE OF THE LOAD

CROSS-REFERENCE TO RELATED APPLICATIONS

This patent application claims priority to, and incorporates by reference in its entirety, U.S. Provisional Patent Application No. 60/643,014 entitled "Method of Detecting RF Power Delivered to a Load and Complex Impedance of the Load, Using Fast Fourier Transform (FFT)" and filed Jan. 11, 2005.

BACKGROUND

1. Technical Field

The disclosed embodiments generally relate to the field of power and impedance measurement.

2. Description of the Related Art

In a typical RF plasma generator arrangement, a high-power RF source (RF power generator) produces an RF signal at a known frequency that is supplied along a power conduit to a plasma chamber. Typically, a severe impedance mismatch between the RF power generator and the plasma chamber is present. Accordingly, an impedance matching network is conventionally interposed between the RF power generator and the plasma chamber.

Because of non-linearities in the plasma chamber and losses in the line and/or in the impedance matching network, the complete RF signal does not reach the plasma chamber. As such, a probe is conventionally employed at the power input to the plasma chamber to detect the voltage and current of the RF signal. By accurately measuring the voltage and current, a user can obtain a better indication of the quality of the plasma and better control etching characteristics for a silicon wafer or other device in the plasma chamber.

Conventional methods of detecting the voltage and current of the RF wave have been proposed. For example, U.S. Reissued Patent Number RE 38,273 to Gerrish et al. describes the use of a sampling probe at the input to a plasma chamber for detecting plasma RF voltage and current. The voltage and current RF signals are mixed with another signal, such as a signal differing from the main signal by between 0.2 KHz and 20 KHz, to produce a heterodyned signal. The heterodyned signal is then processed using a Fast Fourier transform (FFT) algorithm to calculate voltage and current magnitudes and relative phase angle information.

U.S. Pat. No. 5,565,737 to Keane describes the use of an aliasing sampler probe at the input to the plasma chamber for detecting plasma RF voltage and current. The sampler probe uses a sampling signal with a sampling frequency that is slower than the RF fundamental frequency. The sampling frequency is determined by summing the fundamental frequency with an aliasing frequency that is independent of the fundamental frequency and dividing the sum by a positive integer.

One problem with the above-described methods and systems is that the signal generated by the RF power generator can severely degrade due to an impedance mismatch between the RF power generator (or other components) and the plasma chamber. Another problem occurs when an impedance matching network is used between the output of the RF power generator and the input of the plasma chamber. In this case, the RF power-delivered to the plasma chamber can vary due to either adjustments within the impedance matching network and/or losses in the components and circuitry connected between the output of the RF power generator and the input of the plasma chamber. As such, the output of the RF power generator may become unstable due to interaction between the control loop of the RF power generator and the control loop of the impedance matching network. In addition, the use of an aliasing frequency that is independent of the RF fundamental frequency can result in a non-uniform sampled signal.

Other proposed systems include that described in U.S. Pat. No. 6,046,594 to Mavretic describes a method and apparatus for measuring electrical characteristics (e.g. current, voltage, phase, etc.) between a power source and a load at a set of harmonic frequencies to determine information about the load (e.g., load impedance, power dissipation, etc). As described therein, a first circuit detects a set of electrical characteristics of a signal between the power source and the load; a second circuit provides data representing the set of electrical characteristics at a harmonic frequency associated with the signal; and a third circuit receives the data and determines information about the load at the harmonic frequency. However, such a system requires filtering at a particular harmonic frequency. While this may provide information at the particular harmonic frequency, information at the fundamental frequency or other harmonic frequencies may not be obtainable using such a system.

Accordingly, what is needed is a method and system for sampling a detected signal at a location where the signal is tightly coupled to the RF output of the RF power generator and is less affected by the losses in the RF path between the RF power generator and the input of the plasma chamber.

A need exists for a method and system for sampling a detected signal at a sampling frequency that is dependent upon the fundamental frequency of a detected signal.

A further need exists for a method and system for sampling a detected signal such that information pertaining to the fundamental frequency and one or more harmonics is obtainable from the sampling process.

The present disclosure is directed to solving one or more of the above-listed problems.

SUMMARY

Before the present methods, systems and materials are described, it is to be understood that this disclosure is not limited to the particular methodologies, systems and materials described, as these may vary. It is also to be understood that the terminology used in the description is for the purpose of describing the particular versions or embodiments only, and is not intended to limit the scope.

It must also be noted that as used herein and in the appended claims, the singular forms "a," "an," and "the" include plural references unless the context clearly dictates otherwise. Thus, for example, reference to a "load" is a reference to one or more loads and equivalents thereof known to those skilled in the art, and so forth. Unless defined otherwise, all technical and scientific terms used herein have the same meanings as commonly understood by one of ordinary skill in the art. Although any methods, materials, and devices similar or equivalent to those described herein can be used in the practice or testing of embodiments, the preferred methods, materials, and devices are now described. All publications mentioned herein are incorporated by reference. Nothing herein is to be construed as an admission that the embodiments described herein are not entitled to antedate such disclosure by virtue of prior invention.

In an embodiment, a method of detecting characteristics of a load may include detecting one or more characteristics of a signal having a fundamental frequency at the output of a RF power generator, sampling the one or more characteristics of the signal at a sampling frequency to produce a digital sampled signal, and determining one or more characteristics of a load. The sampling frequency may be determined based on a function of the fundamental frequency of the detected signal. The load may be in communication with the RF power generator.

In an embodiment, a system for determining one or more characteristics of a load may include a RF power generator, a load in communication with the RF power generator, a detecting device connected to the output of the RF power generator, an analog to digital (A-D) converter in communication with the detecting device, and a digital signal processor (DSP) in communication with the A-D converter. The detecting device may detect one or more characteristics of a signal. The A-D converter may convert the one or more characteristics of the signal into a digital form. The DSP may determine one or more characteristics of the load from the digital form of the one or more characteristics of the signal.

BRIEF DESCRIPTION OF THE DRAWINGS

Aspects, features, benefits and advantages of the embodiments described herein will be apparent with regard to the following description, appended claims and accompanying drawings where:

DETAILED DESCRIPTION

An RF generator may be used to deliver RF power to a load. In an embodiment, the RF generator may directly deliver the RF power to the load via a coaxial cable. In an alternate embodiment, the RF generator may directly deliver the RF power to the load via a transformation network. Other means of directly or indirectly delivering power to a load may also be used within the scope of the present disclosure.

In an embodiment, the load may include one or more of a plasma chamber, a gaseous tube, a resistive load, and/or a complex load including resistive and/or reactive components, such as a capacitor and/or an inductor. Additional or alternate load devices may also be used within the scope of the present disclosure.

Figure 3:
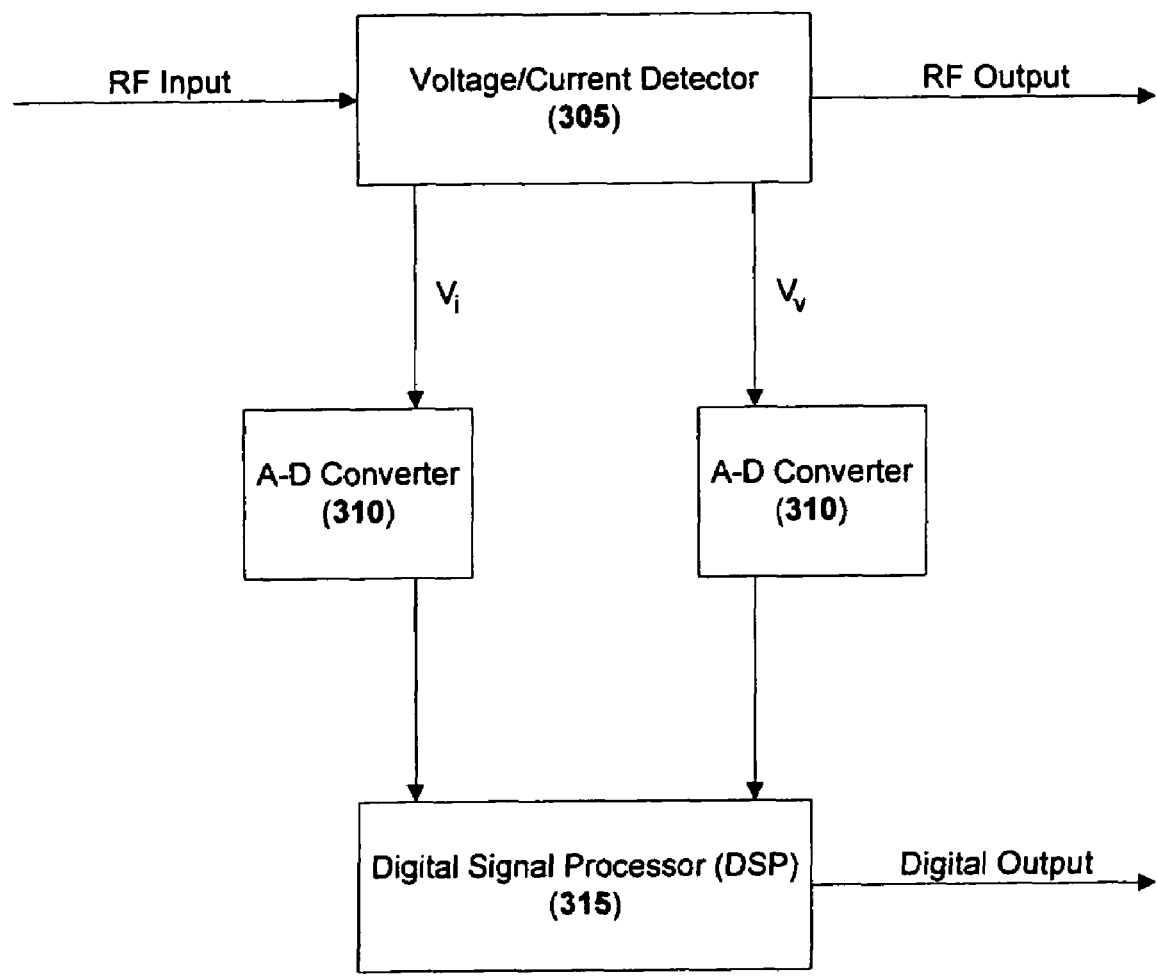
FIG. 3 depicts a block diagram of an exemplary system for a detection and processing circuit according to an embodiment.

A voltage and/or current detecting device, such as 305 in FIG. 3, may be placed at a point where the RF power or impedance is to be measured. For example, the voltage and/or current detecting device 305 may be placed at the output of the RF generator, within the generator or at any point between the RF generator and the load.

Figure 1:
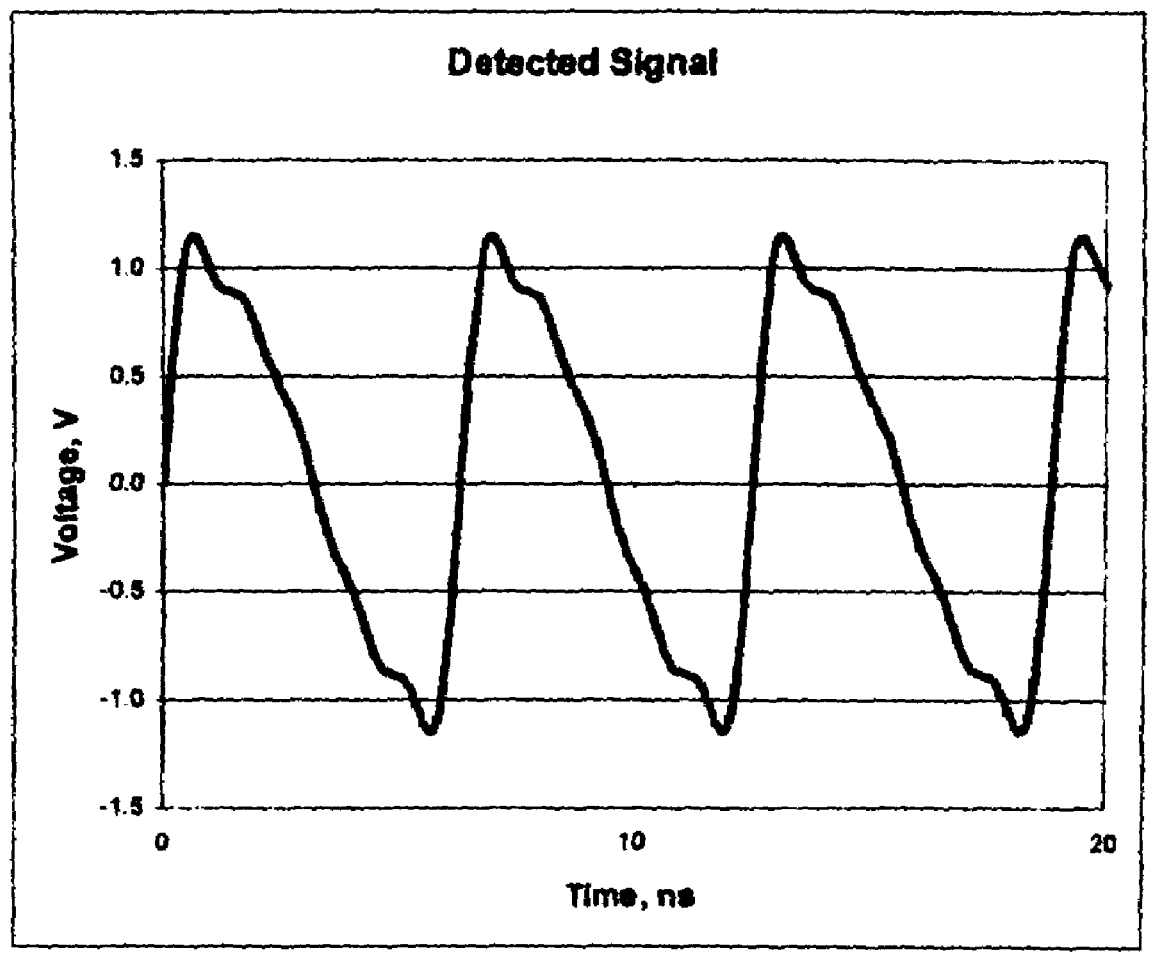
FIG. 1 depicts an exemplary detected signal using a voltage and/or current detecting device according to an embodiment.

Signal characteristics, such as the voltage and/or current delivered by the RF power generator, may be detected through the voltage and/or current detecting device 305 as analog signals. In an embodiment, placing the voltage and/or current detecting device 305 at the output of the RF generator may result in a more stable detected signal than placing the device at other locations within an appropriate electrical circuit. Placing the device at the output of the RF generator may include: (i) positions that physically contact the output; (ii) positions in which the device is in electrical contact with the output with negligible line loss between the output and the location of the detection device; and (iii) positions in which an overall line loss occurs between the RF generator output and the plasma generator input and the detection device is placed at a position where the line loss from the RF generator output to the plasma generator input is no more than half of the overall line loss. FIG. 1 depicts an exemplary detected signal using a voltage and/or current detecting device according to an embodiment.

The detected signal may be passed to a sampling circuit, such as an analog-to-digital converter (310 in FIG. 3). The sampling circuit 310 may sample the voltage and/or current signals at a sampling frequency. In an embodiment, the sampling frequency may be less than a fundamental frequency of the detected signal and it may be a function of the fundamental frequency of the detected signal.

Figure 2:
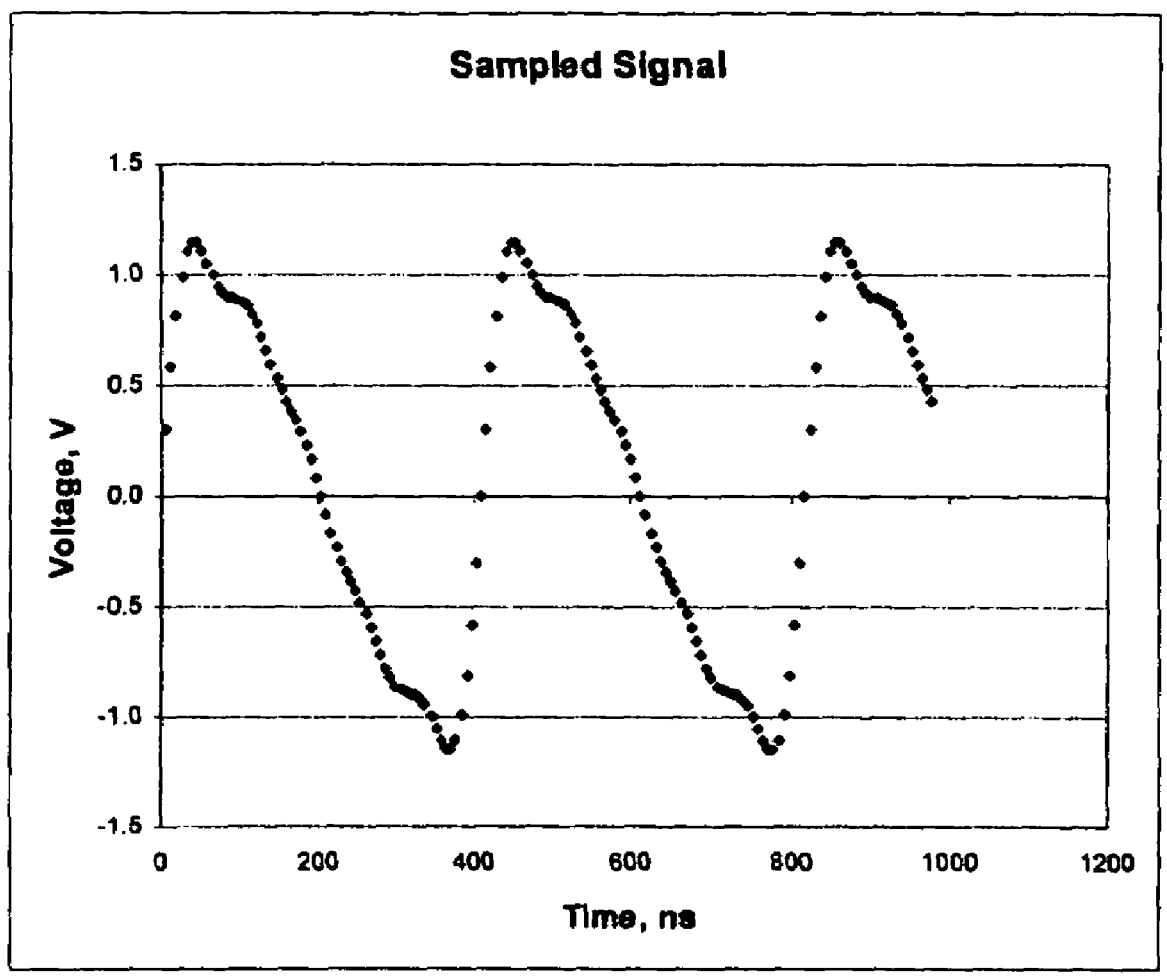
FIG. 2 depicts an exemplary signal sampled from the detected signal of FIG. 1 according to an embodiment.

The sampling frequency may be determined by selecting a desired number of sample points for one period of the sampled signal. For example, the number of sample points may be selected such that the total number of samples in one period of the sampled signal is divisible by $2^n$, where n is a non-negative integer. For example, if n=6, 64 sample points may be generated per period of the sampled signal. In such an embodiment, the sampling frequency may be determined using the equation $$f_s = \frac{2^n f_0}{2^n + 1},$$

where $f_0$ is the fundamental frequency of the detected signal, and $f_s$ is the sampling frequency. FIG. 2 depicts an exemplary signal sampled from the detected signal of FIG. 1 according to an embodiment.

The sampling circuit 310 may be used to convert, for example, analog voltage and/or current signals into digital signals. The sampled voltage and current signals, in digital form, may be passed to a digital signal processor (DSP) 315. An algorithm, such as a Fast Fourier transform (FFT) algorithm, may be performed using the sampled voltage and/or current signal in the DSP 315.

In an embodiment, if both voltage and current signals are sampled, the signals may be provided to a single DSP (as shown in FIG. 3) or to two DSPs (not shown). If two DSPs are used, the clock frequency and cycle may be synchronized between the DSPs. More than two DSPs may also be used within the scope of the present disclosure.

The output of the one or more DSPs 315 may be in a digital form. In an embodiment, the output of the one or more DSPs 315 may include the amplitude of the sampled voltage and/or current signals at one or more frequencies. In an embodiment, the output of the one or more DSPs 315 may include a phase angle between two or more signals. For example, the output of the one or more DSPs 315 may include one or more of the following:

$|V_{f0}|$=Amplitude of the voltage at the fundamental frequency.

$|I_{f0}|$=Amplitude of the current at the fundamental frequency.

$|V_{f2}|$=Amplitude of the voltage at the second harmonic frequency.

$|I_{f2}|$=Amplitude of the current at the second harmonic frequency.

|V_{f3}|=Amplitude of the voltage at the third harmonic frequency.
|I_{f3}|=Amplitude of the current at the third harmonic frequency.
$\theta_{Vf0\text{-}If0}$=Phase angle between the voltage and the current at the fundamental frequency.
$\theta_{Vf2\text{-}If2}$=Phase angle between the voltage and the current at the second harmonic frequency.
$\theta_{Vf3\text{-}If3}$=Phase angle between the voltage and the current at the third harmonic frequency.

Additional and/or alternate amplitudes and/or phase angles may be determined by the one or more DSPs.

Based on the output of the one or more DSPs 315, one or more of the following values may be determined:
$P_D$=Delivered Power to the Load at the fundamental frequency.
$P_F$=Forward Power at the Load at the fundamental frequency.
$P_R$=Reflected Power from the Load at the fundamental frequency.
|$Z_{f0}$|=Magnitude of the Load Impedance at the fundamental frequency.
$Z_{f0}$=Load Impedance at the fundamental frequency in complex form.
$Z_{ch}$=Impedance at the input of the plasma chamber at the fundamental frequency in complex form. This impedance can be calculated based on $Z_{f0}$ and the length and characteristic impedance of the connection between the RF power generator and the input to the plasma chamber. If an impedance matching network is used between the RF power generator and the input to the plasma chamber, then additional information about the values of the components comprising the impedance matching network is also needed.

Similarly, power and impedance calculations may also be performed using other data generated by the one or more DSPs 315. For example, power and impedance calculations may be determined for one or more harmonic frequencies. Additional and/or alternate power and/or impedance calculations may be determined by the one or more DSPs 315.

One advantage of using a FFT algorithm to measure RF power and impedance may be that the FFT algorithm may separate the effect of other frequencies on the frequency of interest. As a result, higher measurement precision may result.

One or more of the power and/or impedance measurements determined above may be used to determine process related information in, for example, a semiconductor manufacturing process. In an embodiment, the power and impedance at the fundamental frequency and/or one or more harmonic frequencies may be used to determine information related to a semiconductor manufacturing process. In an embodiment, mixed product frequencies may additionally or alternately be used to determine information related to a semiconductor manufacturing process.

In an embodiment, changes in one or more power and/or impedance measurements over time may be utilized to determine manufacturing process changes. In an embodiment, one or more power and/or impedance measurements may be used to characterize the load. Alternate and/or additional operations may be performed using the information described above within the scope of the present disclosure.

It will be appreciated that various of the above-disclosed and other features and functions, or alternatives thereof, may be desirably combined into many other different methods, systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A method of detecting one or more characteristics of a load, the method comprising:
   detecting one or more characteristics of a first signal at the output of a Radio Frequency (RF) power generator, wherein the first signal exhibits a fundamental frequency;
   sampling the one or more characteristics of the first signal at a sampling frequency to produce a digital sampled signal, wherein the sampling frequency is determined based on a function of the fundamental frequency of the first signal, wherein the sampling frequency is less than the fundamental frequency of the first signal; and
   determining one or more characteristics of a load from the digital sampled signal, wherein the load is in communication with the RF power generator.

2. The method of claim 1 wherein the one or more characteristics of the first signal comprise one or more of the following:
   a voltage; and
   a current.

3. The method of claim 1 wherein the sampling frequency is determined based on a function having the form $$\frac{2^n f_0}{2^n + 1},$$

wherein n is a non-negative integer and $f_0$ is the fundamental frequency of the first signal.

4. The method of claim 1 wherein determining one or more characteristics of a load from the digital sampled signal comprises determining one or more characteristics of a load from the digital sampled signal using a digital signal processor.

5. The method of claim 1 wherein the one or more characteristics of a load comprise one or more of the following:
   an amplitude of the load voltage at the fundamental frequency;
   an amplitude of the load voltage at a harmonic of the fundamental frequency;
   an amplitude of the load current at the fundamental frequency;
   an amplitude of the load current at a harmonic of the fundamental frequency;
   a phase angle between the load voltage and the load current at the fundamental frequency; and
   a phase angle between the load voltage and the load current at a harmonic of the fundamental frequency.

6. The method of claim 1 wherein the one or more characteristics of a load comprise one or more of the following:
   delivered power to the load at the fundamental frequency;
   delivered power to the load at a harmonic of the fundamental frequency;
   forward power at the load at the fundamental frequency;
   forward power at the load at a harmonic of the fundamental frequency;
   reflected power from the load at the fundamental frequency;

reflected power from the load at a harmonic of the fundamental frequency;

a magnitude of the load impedance at the fundamental frequency;

a magnitude of the load impedance at a harmonic of the fundamental frequency;

a complex form for the load impedance at the fundamental frequency; and a complex form for the load impedance at a harmonic of the fundamental frequency.

7. A system for determining one or more characteristics of a load, the system comprising:

a Radio Frequency (RF) power generator;

a load in communication with the RF power generator;

a detecting device located at the output of the RF power generator;

an analog-to-digital (A-D) converter in communication with the detecting device; and a digital signal processor (DSP) in communication with the A-D converter, wherein the detecting device detects one or more characteristics of a first signal, wherein the A-D converter converts the one or more characteristics of the first signal into a digital form, wherein the A-D converter comprises a sampling device having a sampling frequency that is less than a fundamental frequency of the first signal, wherein the DSP determines one or more characteristics of the load from the digital form of the one or more characteristics of the first signal.

8. The system of claim 7 wherein the load comprises a plasma chamber.

9. The system of claim 7 wherein the load comprises a gaseous tube.

10. The system of claim 7 wherein the load comprises a resistive load.

11. The system of claim 7 wherein the load comprises one or more reactive components.

12. The system of claim 7 wherein the first signal exhibits a fundamental frequency.

13. The system of claim 12 wherein the sampling frequency of the sampling device has the form $$\frac{2^n f_0}{2^n + 1},$$

wherein n is a non-negative integer and $f_0$ is the fundamental frequency.

14. The system of claim 7 wherein the one or more characteristics of a load comprise one or more of the following:

an amplitude of the load voltage at the fundamental frequency;

an amplitude of the load voltage at a harmonic of the fundamental frequency;

an amplitude of the load current at the fundamental frequency;

an amplitude of the load current at a harmonic of the fundamental frequency;

a phase angle between the load voltage and the load current at the fundamental frequency; and a phase angle between the load voltage and the load current at a harmonic of the fundamental frequency.

15. The system of claim 7 wherein the one or more characteristics of a load comprise one or more of the following:

delivered power to the load at the fundamental frequency;

delivered power to the load at a harmonic of the fundamental frequency;

forward power at the load at the fundamental frequency;

forward power at the load at a harmonic of the fundamental frequency;

reflected power from the load at the fundamental frequency;

reflected power from the load at a harmonic of the fundamental frequency;

a magnitude of the load impedance at the fundamental frequency;

a magnitude of the load impedance at a harmonic of the fundamental frequency;

a complex form for the load impedance at the fundamental frequency; and a complex form for the load impedance at a harmonic of the fundamental frequency.

16. The system of claim 7, further comprising:

an impedance matching network in communication with the RF power generator and the load.

* * * * *

UNITED STATES PATENT AND TRADEMARK OFFICE
CERTIFICATE OF CORRECTION

PATENT NO.         : 7,298,128 B2  Page 1 of 1
APPLICATION NO. : 11/329977
DATED              : November 20, 2007
INVENTOR(S)      : Imran Ahmed Bhutta It is certified that error appears in the above-identified patent and that said Letters Patent is hereby corrected as shown below:

On the Title Page, Item (54) delete "Powder" and insert --Power--.

Signed and Sealed this

Nineteenth Day of August, 2008

JON W. DUDAS
*Director of the United States Patent and Trademark Office*

UNITED STATES PATENT AND TRADEMARK OFFICE
CERTIFICATE OF CORRECTION

PATENT NO. : 7,298,128 B2 Page 1 of 1
APPLICATION NO. : 11/329977
DATED : November 20, 2007
INVENTOR(S) : Imran Ahmed Bhutta It is certified that error appears in the above-identified patent and that said Letters Patent is hereby corrected as shown below:

On the Title Page, Item (54) and Column 1, line 1, delete "Powder" and insert --Power--.

This certificate supersedes the Certificate of Correction issued August 19, 2008.

Signed and Sealed this

Sixteenth Day of September, 2008

JON W. DUDAS
*Director of the United States Patent and Trademark Office*